US012158705B2

(12) United States Patent
Lyons et al.

(10) Patent No.: US 12,158,705 B2
(45) Date of Patent: Dec. 3, 2024

(54) END-OF-LIFE MONITORING OF DYNAMIC GAS LOCK MEMBRANES AND PUPIL FACET MIRRORS AND DETECTION OF MEMBRANE RUPTURE IN LITHOGRAPHIC APPARATUSES

(71) Applicants: ASML Holding N.V., Veldhoven (NL); ASML Netherlands B.V., Veldhoven (NL)

(72) Inventors: Joseph Harry Lyons, Wilton, CT (US); Jimi Hendriks, Eindhoven (NL); Ping Zhou, Wilton, CT (US); Zhuangxiong Huang, Eindhoven (NL); Reinier Theodorus Martinus Jilisen, Eindhoven (NL)

(73) Assignee: ASML Holding N.V. & ASML Netherlands B.V., Veldhoven (NL)

( * ) Notice: Subject to any disclaimer, the term of this patent is extended or adjusted under 35 U.S.C. 154(b) by 17 days.

(21) Appl. No.: 17/909,348

(22) PCT Filed: Mar. 1, 2021

(86) PCT No.: PCT/EP2021/055081
§ 371 (c)(1),
(2) Date: Sep. 2, 2022

(87) PCT Pub. No.: WO2021/175797
PCT Pub. Date: Sep. 10, 2021

(65) Prior Publication Data
US 2023/0083834 A1 Mar. 16, 2023

Related U.S. Application Data

(60) Provisional application No. 62/985,478, filed on Mar. 5, 2020.

(51) Int. Cl.
*G03F 7/00* (2006.01)
(52) U.S. Cl.
CPC ........ *G03F 7/70833* (2013.01); *G03F 7/7085* (2013.01); *G03F 7/70916* (2013.01)
(58) Field of Classification Search
CPC ............... G03F 7/70833; G03F 7/7085; G03F 7/70983; G03F 7/70916; G03F 7/70;
(Continued)

(56) References Cited

U.S. PATENT DOCUMENTS 8,400,630 B2    3/2013   Hemsendorf et al.
2020/0218160 A1  7/2020  Kruithof et al.

FOREIGN PATENT DOCUMENTS

DE    102012215698 A1 *  8/2013  ......... G03F 7/70191
DE    102017216703 A1    3/2019
(Continued)

OTHER PUBLICATIONS

English translation of WO-2019057708-A1 (Year: 2019).*
(Continued)

*Primary Examiner* — Christina A Riddle
(74) *Attorney, Agent, or Firm* — Sterne, Kessler, Goldstein & Fox P.L.L.C.

(57) ABSTRACT

Embodiments herein describe methods, devices, and systems for rupture detection and end-of-life monitoring of dynamic gas lock (DGL) membranes and pupil facet mirrors in lithographic apparatuses. A method for detecting rupture of a dynamic gas lock membrane in a lithographic apparatus includes illuminating the dynamic gas lock membrane with a measurement beam using a radiation source, in which the dynamic gas lock membrane is arranged between a wafer and projection optics of the lithography apparatus, and determining whether any radiation from the measurement beam is reflected from the dynamic gas lock membrane by (Continued)

using reflection collection optics, in which the reflection collection optics are arranged above the dynamic gas lock membrane. A rupture in the dynamic gas lock membrane is detected if no radiation is reflected from the dynamic gas lock membrane. If radiation is reflected from the dynamic gas lock membrane, the dynamic gas lock membrane is not ruptured.

20 Claims, 10 Drawing Sheets

(58) Field of Classification Search
CPC .............. G03F 7/70691; G03F 7/70716; G03F 7/70725; G03F 7/70733–7075; G03F 7/70783; G03F 7/70791; G03F 7/708–70941; G03F 7/70975; G03F 7/70991; H05G 2/00–008
USPC ...... 355/18, 30, 52–55, 67–77, 133; 356/51, 356/928, 237.1–237.6
See application file for complete search history.

(56) References Cited

FOREIGN PATENT DOCUMENTS

| JP | H05217857 | * | 8/1993 | ......... G03F 7/70841 |
| WO | WO 2014/020003 A1 | | 2/2014 | |
| WO | WO-2019057708 A1 | * | 3/2019 | ......... G03F 7/70075 |
| WO | WO 2019/115218 A1 | | 6/2019 | |

OTHER PUBLICATIONS

English translation of DE-102012215698-A1 (Year: 2013).*
English translation of JP H05-217857 (Year: 1993).*
International Search Report and Written Opinion of the International Searching Authority directed to related International Patent Application No. PCT/EP2021/055081, mailed Sep. 10, 2021; 11 pages.

* cited by examiner

END-OF-LIFE MONITORING OF DYNAMIC GAS LOCK MEMBRANES AND PUPIL FACET MIRRORS AND DETECTION OF MEMBRANE RUPTURE IN LITHOGRAPHIC APPARATUSES

CROSS-REFERENCE TO RELATED APPLICATIONS

This application claims priority of U.S. Provisional Patent Application No. 62/985,478, which was filed on Mar. 5, 2020, and which is incorporated herein in its entirety by reference.

FIELD

The present disclosure relates to systems and methods for optical detection of rupture of dynamic gas lock (DGL) membranes and monitoring health of DGL membranes and pupil facet (PF) mirrors in lithographic apparatuses.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

In EUV lithography, a dynamic gas lock (DGL) membrane may be employed to prevent wafer contaminants and/or debris from entering the projection optics box of the lithographic apparatus. The DGL membrane may also filter out various wavelengths, such as deep ultraviolet (DUV) and/or infrared (IR) radiation which may affect overlay or critical dimension uniformity (CDU) in a product. The DGL membrane employs a thin, nearly transparent membrane that is positioned in between the wafer and the projection optics box. In some embodiments, the DGL membrane replaces a dynamic gas lock construct that relied on gas flow to accomplish this same result.

The DGL membrane is thin as possible (e.g., about 10 to 50 nanometers thick) in order to minimize loss of light power. However, the nanoscale dimensions result in the DGL membrane being fragile and susceptible to rupture. Since the DGL membrane filters out various wavelengths, a ruptured membrane can affect overlay or CDU in a product. A ruptured membrane cannot prevent contaminants from entering the projection optics box, thus necessitating replacement of ruptured membrane with a new one. Therefore, it is important to detect any breaks or ruptures in the DGL membrane in order to prevent potential performance impact and damage of the projection optics box.

Schemes of detecting membrane rupture by measuring changes in pressure between the projection optics and wafer stage compartment have proven unreliable. In some embodiments, the intensity at the wafer plane can be monitored, where a DGL membrane rupture would result in a sudden increase in intensity. However, methods for detecting DGL membrane rupture by monitoring intensity at the wafer plane may be limited because the detection may solely occur when the lithographic apparatus is in operation. Ruptures that occur while the lithographic apparatus is not in operation (e.g., when the apparatus idle or when the apparatus is being serviced) may go undetected, resulting in wafer damage. Furthermore, monitoring intensity at the wafer plane may necessitate frequent calibration measurements which are complex, difficult to maintain, and degrade utilization.

Additionally, monitoring and diagnostics for determining the health or end-of-life status of DGL membranes and other scanner optics, such as pupil-facet (PF) mirrors may utilize EUV light. However, such methods may be limited because of their dependence on EUV light, which may be costly in terms of expensive machine time needed.

SUMMARY

Accordingly, the present disclosure provides methods, devices, and systems for end-of-life monitoring of dynamic gas lock (DGL) membranes and pupil facet mirrors and optical detection of rupture of DGL membranes in lithographic apparatuses. The monitoring and detection may occur during any state of a lithographic apparatus, including during service, during transient or idle states, and during operation. By utilizing optical detection methods, as well as infrared camera monitoring methods, DGL membranes in lithographic apparatuses may be continuously monitored in order to detect ruptures, replace ruptured DGL membranes in a timely manner, and prevent any disruption to service of the machines.

In some embodiments, a method of detecting rupture of a dynamic gas lock membrane in a lithographic apparatus is disclosed. The method includes illuminating the dynamic gas lock membrane with a measurement beam using a radiation source, in which the dynamic gas lock membrane is arranged between a wafer and projection optics of the lithography apparatus, determining whether any radiation from the measurement beam is reflected from the dynamic gas lock membrane by using reflection collection optics, in which the reflection collection optics are arranged above the dynamic gas lock membrane, and detecting whether or not the dynamic gas lock membrane has ruptured based on the determination. In an embodiment, the dynamic gas lock membrane is ruptured if no radiation is reflected from the dynamic gas lock membrane. In another embodiment, the dynamic gas lock membrane is not ruptured if radiation is reflected from the dynamic gas lock membrane.

In some embodiments, a lithographic apparatus includes an illumination system, a support structure, a substrate table, and a projection system. The illumination system is configured to condition a radiation beam. The support structure is constructed to support a patterning device. The substrate table is configured to hold a substrate. The projection system is configured to project a pattern imparted to the radiation beam by the patterning device onto a target portion of a substrate. The lithographic apparatus also includes a dynamic gas lock membrane, a radiation source, reflection collection optics, and a detector. The dynamic gas lock membrane is arranged between the projection system and the substrate structure. The radiation source is configured to illuminate the dynamic gas lock membrane with a measurement beam. The reflection collection optics is arranged above the dynamic gas lock membrane and configured to determine whether any radiation from the measurement beam is reflected from the dynamic gas lock membrane. The detector is configured to detect whether or not the dynamic gas lock membrane has ruptured based on the determination. In an embodiment, the dynamic gas lock membrane is ruptured if no radiation is reflected from the dynamic gas lock membrane. In another embodiment, the dynamic gas lock membrane is not ruptured if radiation is reflected from the dynamic gas lock membrane.

In some embodiments, a method of monitoring a dynamic gas lock membrane in a lithographic apparatus is disclosed. The method includes arranging an infrared camera at the dynamic gas lock membrane, in which the dynamic gas lock membrane is arranged between a wafer and projection optics of the lithography apparatus, and monitoring the dynamic gas lock membrane using the infrared camera.

Further features of the disclosure, as well as the structure and operation of various embodiments of the disclosure, are described in detail below with reference to the accompanying drawings. It is noted that the disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the disclosure and to enable a person skilled in the relevant art(s) to make and use the disclosure.

Figure 1A:
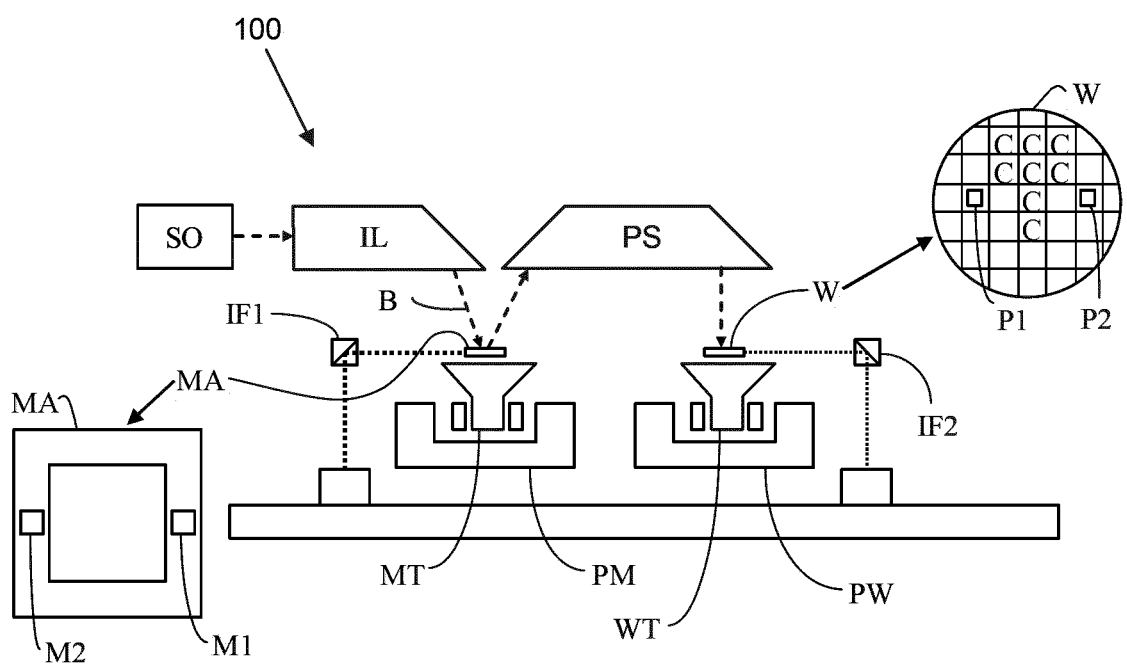
FIG. 1A is a schematic illustration of a lithographic apparatus, according to embodiments of the present disclosure.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this disclosure. The disclosed embodiment(s) merely exemplify the disclosure. The scope of the disclosure is not limited to the disclosed embodiment(s). The disclosure is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure may be implemented.

Example Lithographic Systems

Figure 1B:
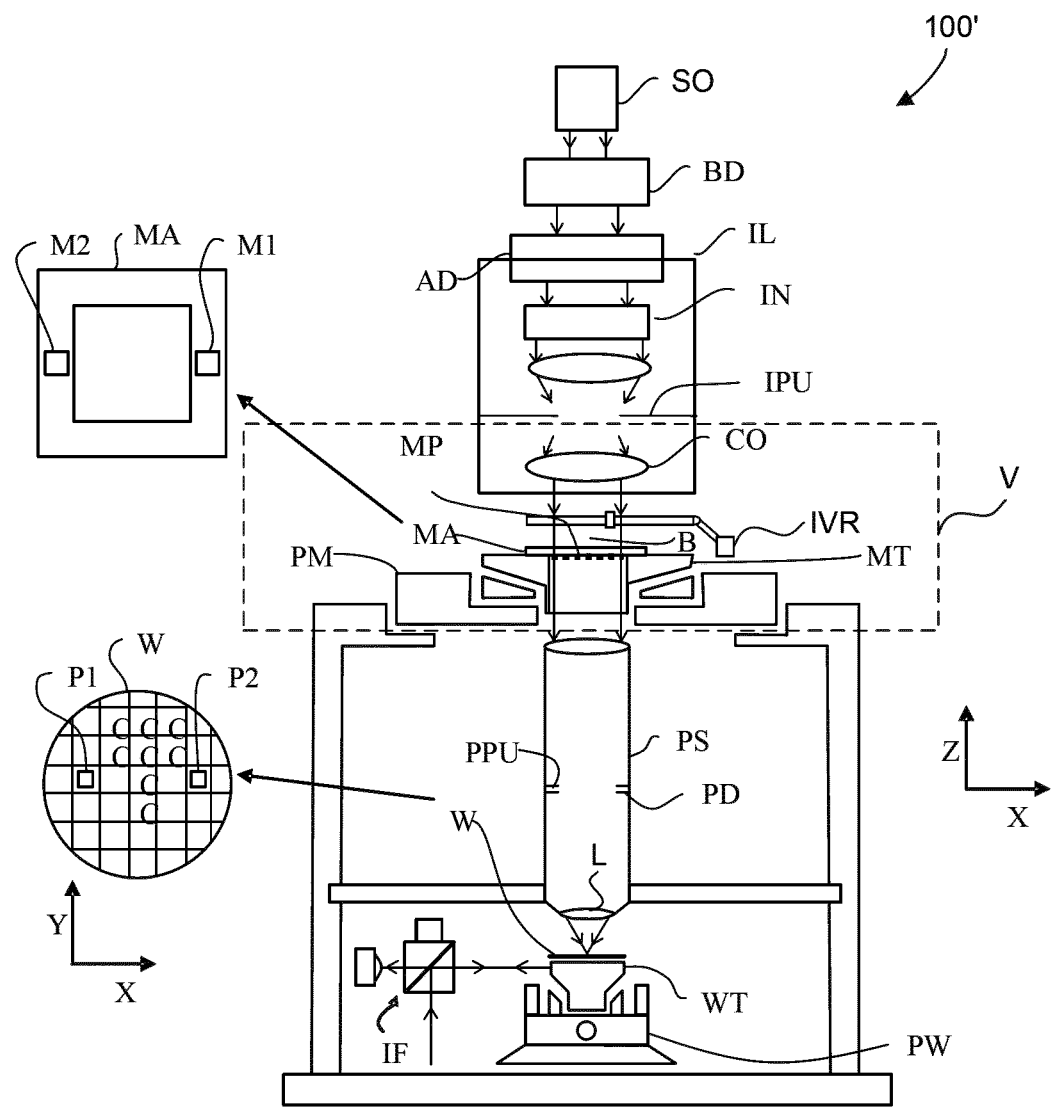
FIG. 1B is a schematic illustration of a transmissive lithographic apparatus, according to embodiments of the present disclosure.

FIGS. 1A and 1B are schematic illustrations of a lithographic apparatus 100 and lithographic apparatus 100', respectively, in which embodiments of the present disclosure may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such embodiments, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other embodiments, the source SO can be an integral part of the lithographic apparatus 100, 100', for example, when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber V, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.
2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.
3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
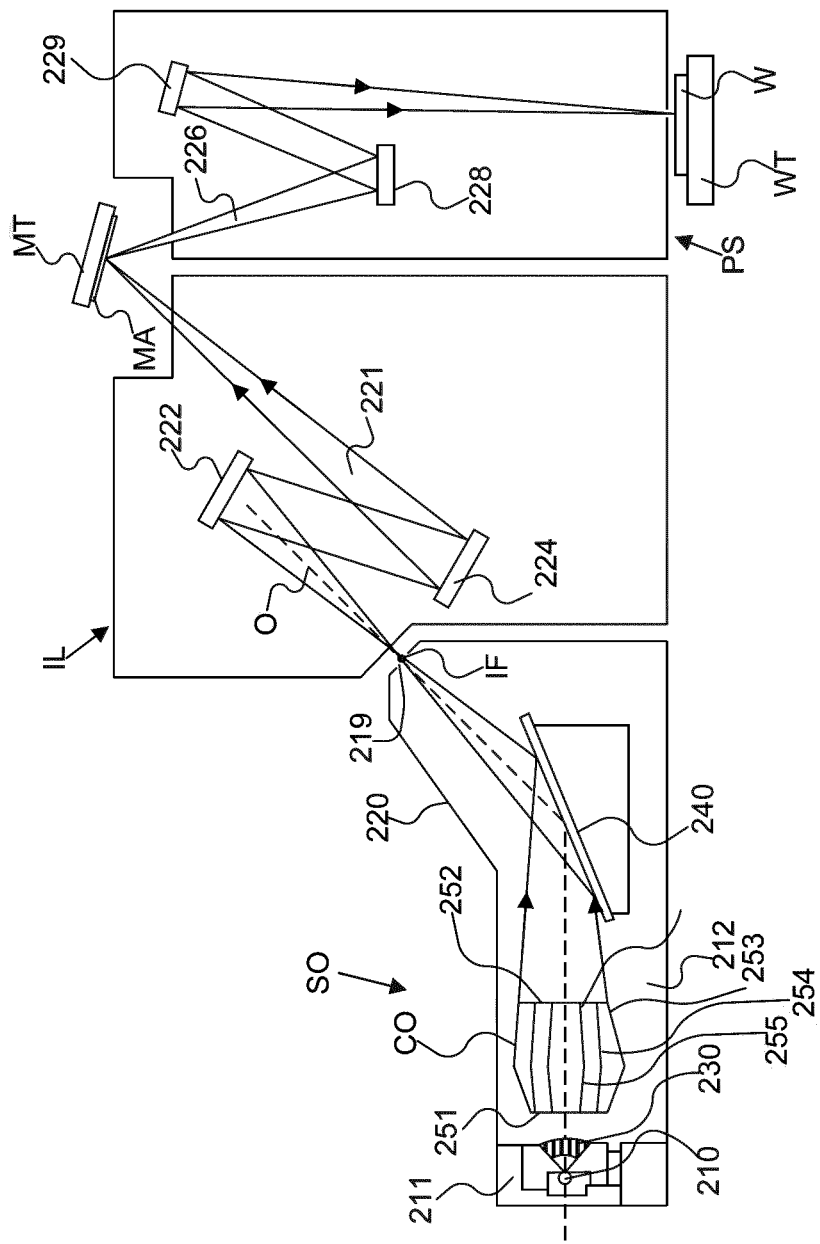
FIG. 2 is a more detailed schematic illustration of the reflective lithographic apparatus, according to embodiments of the present disclosure.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220. The source collector apparatus SO includes a source chamber 211 and a collector chamber 212 and is configured to produce and transmit EUV radiation. EUV radiation may be produced by a gas or vapor, for example Xe gas, Li vapor, or Sn vapor in which an EUV radiation emitting plasma 210 is created to emit radiation in the EUV range of the electromagnetic spectrum. The EUV radiation emitting plasma 210, at least partially ionized, can be created by, for example, an electrical discharge or a laser beam. Partial pressures of, for example, 10 Pa of Xe, Li, Sn vapor, or any other suitable gas or vapor may be required for efficient generation of the radiation. In an embodiment, a plasma of excited tin (Sn) is provided to produce EUV radiation.

The radiation emitted by the EUV radiation emitting plasma 210 is passed from the source chamber 211 into the collector chamber 212 via an optional gas barrier or contaminant trap 230 (in some embodiments also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO, which can be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIG. 2, for example there may be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Embodiments of DGL Membrane and Optical Detection of Membrane Rupture

Figure 3:
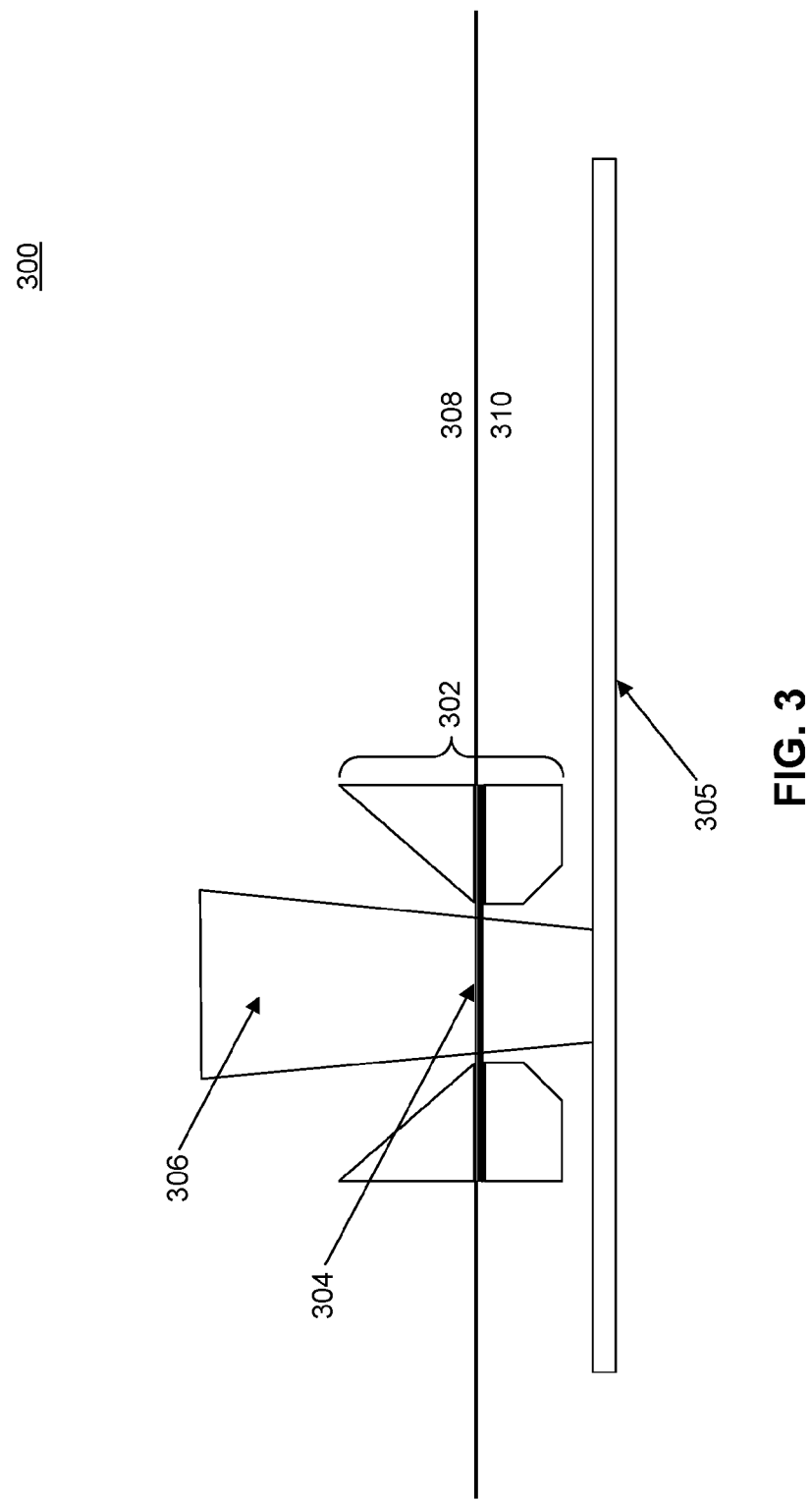
FIG. 3 is a schematic diagram of interface 300 in a lithographic apparatus, according to embodiments of the present disclosure.

FIG. 3 is a schematic diagram of interface 300 in a lithographic apparatus, according to embodiments of the present disclosure. For example, interface 300 is an interface between the wafer stage and projection optics in the lithographic apparatus. In some embodiments, interface 300 may represent a position in between wafer table WT and projection system PS in lithographic apparatus 100 shown in FIG. 2. Interface 300 illustrates a dynamic gas lock (DGL) 302 that can be facilitated by a dynamic gas lock (DGL) membrane 304. The DGL 302 may represent a gas flow that is generated around membrane 304 to displace or carry away contaminants and debris that may fall on the membrane 304. In some embodiments, DGL 302 may include a gas flow that flows downwards from the membrane to the wafer, as well as a gas flow above the membrane in order to keep the pressure at a certain level.

The DGL 302 and membrane 304 may be located at a position adjacent the wafer table (e.g., a position separating a wafer compartment from the projection system). In one aspect, region 308 represents the projection optics area, whereas region 310 represents the wafer stage area. The membrane 304 can be utilized to prevent contamination of wafer 305 by separating regions 308 and 310. The membrane 304 can also block light of certain wavelengths (such as deep UV), while allowing UV light represented by light beam 306 to pass through to wafer 305.

In some embodiments, membrane 304 may be fabricated by depositing multiple layers on a polysilicon core, in which the layers are deposited (stacked) on top of each other, one at a time. For example, the core film may be about 25 nm thick, whereas the multiple layers may each be about 2-4 nm thick. The multiple layers may comprise different functional layers that are utilized to block and/or allow radiation of predetermined wavelength ranges to pass through the membrane. In some aspects, the layers of the membrane stack may include (1) a capping layer comprising an oxidation barrier, (2) a core layer comprising a deep ultraviolet (UV) active layer, (3) an active layer comprising an infrared (IR) suppression or active layer, and (4) an additional capping layer comprising another oxidation barrier. The first and fourth layers of the membrane stack can be capping layers that provide oxidation barriers for the core layer and active layer, respectively. The second and third layers of the membrane stack can comprise active layers that block deep UV and infrared light, respectively from passing through the membrane. Although only four layers are described herein, it should be appreciated that the membrane 304 may include any number of layers.

Membrane 304 may be fragile due to the nanoscale thickness of the membrane 304 and thus susceptible to rupture. For example, membrane 304 may have an expected lifetime of about six months and may need to be replaced because of performance degradation. In some embodiments, performance degradation may occur in terms of EUV transmission loss over time and/or a decrease in EUV transmission uniformity, which may impact on-target performance and on machine throughput. In some embodiments, a risk of rupture over time may also occur with different membrane concepts. In some aspects, a rupture of membrane 304 may be detected by monitoring the intensity of light beam 306 at wafer 305 while the lithographic apparatus is in operation. For example, membrane 304 may block about 10-15% of UV light. In some embodiments, a sudden increase in intensity of light beam 306 (e.g., an increase of the light beam intensity to about 50%) indicates that the membrane 304 has most likely ruptured. Thus, membrane rupture may be detected by monitoring intensity of the light beam 306 in between wafer exposures while the lithographic apparatus is in use.

In these aspects, membrane rupture detection by monitoring intensity of light beam 306 may necessitate that the lithographic apparatus be in operation in order for the detection to occur. In other words, in some aspects membrane rupture detection are time-sensitive and cannot be performed at any time. Furthermore, monitoring intensity of light beam 306 at wafer 305 can provide an indirect method in which the membrane 304 itself is not directly measured. Accordingly, the present disclosure provides some embodiments for direct measurement and continuous monitoring of dynamic gas lock (DGL) membranes in order to optically detect membrane rupture in lithographic apparatuses during any state, including during service, during transient or idle states, and during operation.

Figure 4:
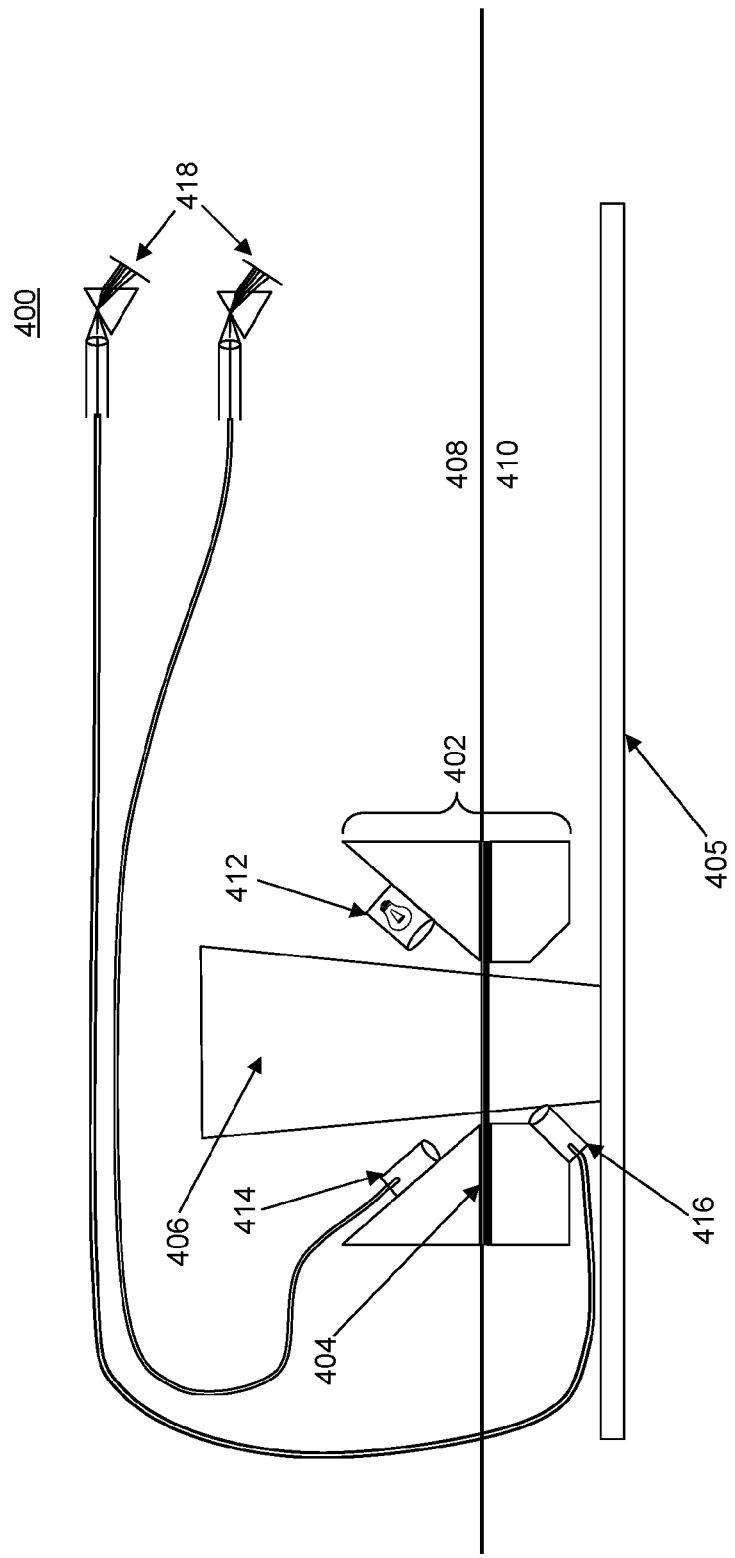
FIG. 4 is a schematic diagram of interface 400, which illustrates the proposed optical detection scheme, according to embodiments of the present disclosure.

FIG. 4 is a schematic diagram of interface 400, which illustrates the proposed optical detection scheme, according to embodiments of the present disclosure. In one aspect, interface 400 can be an interface between the wafer stage and projection optics in the lithographic apparatus. In some embodiments, interface 400 may represent a position in between wafer table WT and projection system PS in lithographic apparatus 100 shown in FIG. 2.

Similarly to interface 300 shown in FIG. 3, interface 400 can also illustrate a dynamic gas lock (DGL) 402, DGL membrane 404, wafer 405, light beam 406, region 408, and region 410. In some embodiments, dynamic gas lock (DGL) 402, DGL membrane 404, wafer 405, light beam 406, region 408, and region 410 represent exemplary embodiments of dynamic gas lock (DGL) 302, DGL membrane 304, wafer 305, light beam 306, region 308, and region 310, respectively, as shown in FIG. 3. In some embodiments, FIG. 4 also illustrates additional optical devices utilized for rupture detection of membrane 404. In particular, interface 400 can include a light source 412, a reflection collector 414, a transmission collector 416, and spectrum analyzers or intensity detectors 418.

In some embodiments, light source 412 may comprise a white light source with a broad optical bandwidth. In some embodiments, light source 412 may comprise a single wavelength source, and membrane 404 may reflect over a broad wavelength range (e.g., IR, DUV, etc.). Light source 412 may be arranged above the membrane 404 and configured to illuminate the membrane 404 with a measurement beam off-axis, such that the measurement beam from light source 412 does not interfere with light beam 406. Reflection collector 414 may be arranged above the membrane and configured to collect light that is reflected back from membrane 404. In some embodiments, the reflected light may comprise a broad range of wavelengths, such as ranging between 200 to 800 nm. Transmission collector 416 may be arranged below the membrane and configured to collect light that is transmitted through membrane 404. Spectrum analyzers or intensity detectors 418 may be coupled to reflection collector 414 and transmission collector 416 to detect reflected light and changes in transmitted light intensity. In some embodiments, reflection collector 414 and transmission collector 416 may be referred to herein as reflection collection optics and transmission collection optics, respectively.

In some embodiments, light may be reflected from and/or transmitted through membrane 404 depending on the condition of membrane 404. In some embodiments, light source 412 illuminates membrane 404 with the measurement beam, and light reflects from membrane 404 and is collected by reflection collector 414 when the membrane 404 is intact and not ruptured. However, if membrane 404 is ruptured, then light does not reflect from membrane 404, and there is no reflected light that is collected by reflection collector 414. In some embodiments, any break or rupture in membrane 404 would typically cause the membrane 404 to completely fall apart, which would prevent any reflection of light.

Furthermore, light may be transmitted through membrane 404 and collected by transmission collector 416. The intensity of the transmitted light is dependent on whether the membrane 404 is ruptured or still intact. A higher intensity of transmitted light may indicate that the membrane 404 has ruptured, whereas a lower intensity of transmitted light may indicate that the membrane 404 is still intact. Transmission collector 416 may collect this transmitted light which is utilized by spectrum analyzers or intensity detectors 418 to determine the intensity of transmitted light and ultimately determine whether or not membrane 404 has ruptured.

In some embodiments, reflection collector 414 and spectrum analyzers or intensity detectors 418 may solely be used together to detect rupture of membrane 404 based on collection and detection of reflected light, without requiring the use of transmission collector 416.

In additional or alternative embodiments, both reflection collector 414 and transmission collector 416 can be used together with spectrum analyzers or intensity detectors 418 for the rupture detection. In some examples, transmission collector 416 may be utilized in addition to reflection collector 414 to confirm the results from reflection collector 414. For example, transmission collector 416 may be used to check whether or not the light source 412 is properly working and identify if the lack of a reflected light signal is the result of a faulty or defective light source 412.

In some embodiments, reflection collector 414 and transmission collector 416 may be coupled to spectrum analyzers or intensity detectors 418 that are configured to detect light that is reflected back from membrane 404 and/or detect increases in light intensity that is transmitted through membrane 404.

In some embodiment, by utilizing light source 412, reflection collector 414 and/or transmission collector 416, and spectrum analyzers or intensity detectors 418, DGL membranes may be monitored continuously and/or at any time in order to detect membrane rupture, rather than waiting for detection in between wafer exposures while the lithographic apparatus is in use. Thus, the optical detection methods described herein can allow for a faster rupture detection than other methods as a result of the continuous monitoring.

In some embodiments, spectrum analyzers or intensity detectors 418 may comprise two detectors that are coupled to reflection collector 414 and transmission collector 416. In some embodiments, the ratio of the intensity of the two detectors 418 would remain constant until a rupture occurred in membrane 404. If a Brewster angle can be achieved, this configuration may be beneficial where the light source 412 is S polarized, and none of the S polarized light can propagate to the transmission detector unless the membrane is ruptured.

Given that there may be a significant amount of scattered light of many wavelengths from the imaging beam (e.g., light beam 406), the detection may be timed to run in-between pulses of the imaging light which is non-contagious.

In another embodiment, spectrum analyzers or detectors 418 with narrow band filters may be employed. Light that leaks into the detectors 418 from the imaging light beam 406 may be ignored. This may also utilize an adsorbing characteristic of the membrane for deep ultraviolet (DUV) wavelengths. A sudden increase in detected DUV radiation in the ratio of reflective to transmission intensity, as detected by the one or more detectors, would signal a rupture in membrane 404.

Exemplary Embodiments for Monitoring DGL Membrane and Pupil-Facet Mirrors

In some embodiments, in-line monitoring includes using an infrared camera for health monitoring of scanner optics independent of EUV light, particularly for DGL membrane rupture, contamination and deterioration, and for pupil-facet (PF) mirror degradation. In some embodiments, the infrared camera may be high-resolution and allow spatially-resolved monitoring of DGL membranes and PF mirrors.

In some embodiments, diagnostics for identifying the health status of scanner optics (including mirrors and membranes) mainly utilize EUV light. For example, DGL membrane contamination), degradation, and rupture may be detected by EUV light using slit sensors and energy sensors. Membrane diagnosis may occur indirectly by in-depth analyzing EUV transmission, imaging, and slit profile change. Similarly, PF mirror degradation may be monitored by scanning EUV light beam over the PF mirror surface and determining the spatial distribution of transmission over the PF mirror.

In some embodiments, methods may be limited because of their dependence on EUV light. DGL membrane rupture often occurs without EUV light during service and/or transient states when the system is most disturbed, and therefore increases the chances of have falling particles and/or pressure variations in the system (e.g., lithographic apparatus).

Figure 5A:
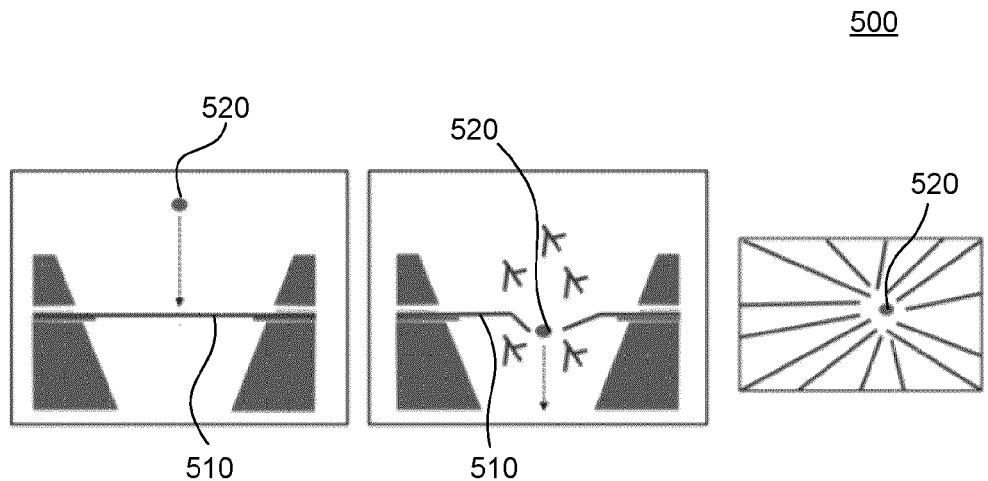
FIGS. 5A-5D are schematic diagrams, which illustrate examples of dynamic gas lock membrane rupture, according to embodiments of the present disclosure.
Figure 5B:
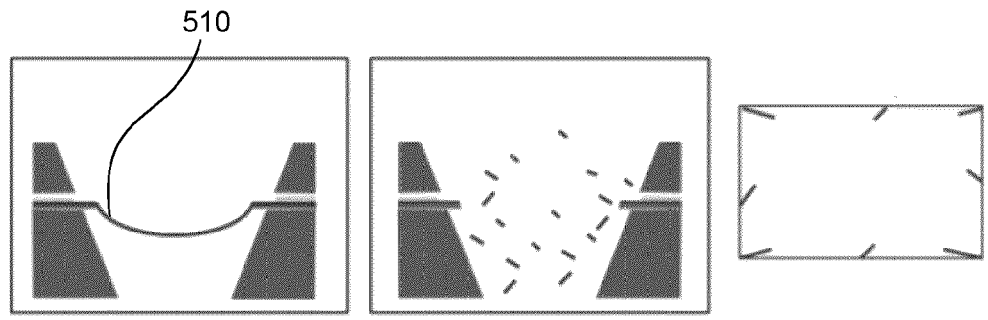
Figure 5C:
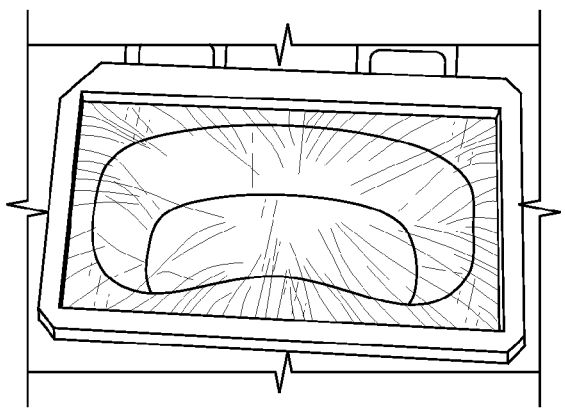
Figure 5D:
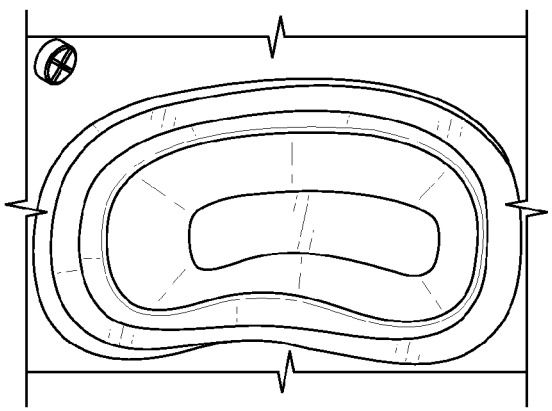

FIGS. 5A-5D are schematic diagrams, which illustrate examples of dynamic gas lock membrane rupture, according to embodiments of the present disclosure. In one example, FIG. 5A shows examples of a particle-induced DGL membrane rupture, and FIG. 5B shows examples of a pressure-induced DGL membrane rupture. As shown in the first two panels of FIG. 5A, a particle 520 may rupture a membrane 510. The third panel of FIG. 5A illustrates a top view of membrane 510 after rupture. FIG. 5B shows a pressure-induced rupture of membrane 510 in the first two panels, and the third panel of FIG. 5B shows a top view of membrane 510 after rupture. FIG. 5C shows an example image of a particle-induced rupture in a membrane, and FIG. 5D shows an example image of a pressure-induced rupture in a membrane. In some embodiments, ⅔ of ruptures may occur due to falling particles, whereas ⅓ of ruptures may occur due to a pressure delta or difference in the system.

When DGL membrane rupture occurs, it is typically discovered hours later when the system is recovered and EUV light is turned on again. Additional time is then needed to put the system in service state to replace the broken DGL membrane, which means disruption to service and additional unavailability of the machine for use.

Additionally, it can be difficult to detect when exactly a DGL membrane breaks, and what exactly cause the DGL membrane rupture. It may be beneficial to utilize a sensor that can pinpoint when the membrane breaks in order to obtain a more robust membrane and/or more DGL membrane-friendly sequences for machine service and recovery.

In some embodiments, DGL membrane rupture detection architecture is a check before every lot, which consumes some (minor) lot overhead budget, and eventually leads to potential productivity loss. DGL membrane degradation and lifetime can also be dependent on customer usage. In some embodiments, DGL membranes are currently swapped out based on its fixed expected short lifetime of 6 months to secure its performance, which means that some DGL membranes are swapped out unnecessarily and wasted. To avoid and mitigate such waste, diagnostics for DGL membrane contamination, degradation and end-of-life prediction can be desired.

Additionally, pupil-facet mirror (PFM) degradation monitoring by scanning EUV light can be costly, in terms of expensive machine time needed and availability of budget.

In some embodiments, systems, devices, and methods for utilizing an infrared camera for monitoring DGL membranes and PF mirrors are described herein. In some aspects, these may provide a simpler, faster and more straightforward diagnostic system, rather than using EUV transmission, imaging and slit profile change.

In some embodiments, using an infrared camera is independent of EUV light, which means that diagnostics can be run in all vacuum states (during service, during transient states, and during operation). Thus, there may be no need to wait for EUV light to be turned on or for the lithographic apparatus to be in operation in order to perform the diagnostics. For DGL membrane rupture detection, this can lead to a significant difference over some EUV-light-based detection techniques and can allow availability gain because there may be no need to wait many hours for system recovery.

In some embodiments, DGL membrane rupture detection using the infrared camera methods can be run unstopped through all sequences at any time. So it is possible to pinpoint when a DGL membrane breaks, which can be desirable information for future improvements to obtaining a more robust membrane and/or a more DGL membrane-friendly sequences for machine service and recovery.

In some embodiments, a DGL membrane rupture detection method does not consume lot overhead budget (as no need to use EUV light and slit sensor, energy sensor, etc.), and therefore, no productivity loss is expected. Similarly, in some embodiments for DGL membrane contamination and degradation monitoring, and also for PF mirror degradation monitoring, the diagnostics tests can be run independently from machine operation because no need to use EUV light and slit sensor, energy sensor, and the like. Therefore, there may be no disruption to normal customer use of the machine, which may lower any availability and productivity losses.

In some embodiment, using an infrared camera for the membrane monitoring, thermal radiation (or reflection/scattering of the existing IR on the system) may be captured. Thus, additional illumination sources (e.g., an EUV light source) might not be needed for the detection, which prevents any extra disturbances (due to additional illumination) from being introduced into the system.

In some embodiments, spatially-resolved monitoring with high resolution for DGL membrane contamination and degradation may allow for identifying non-uniform contamination and/or stack quality deterioration, which are key performance indicators or criterion for DGL membrane end-of-life.

In some embodiments, sufficiently high resolution for PF mirror monitoring may be utilized for parallel detection of all facets in one go. For example, each individual mirror facet may have sufficient resolution to make the damage spot (if present) visible. Thus, when a damage spot is present on a PF mirror, it is expected that both the reflected/scattered IR and the thermal emission from the PF mirror surface itself will show spot-like pattern.

Example Methods of Operation

Figure 6:
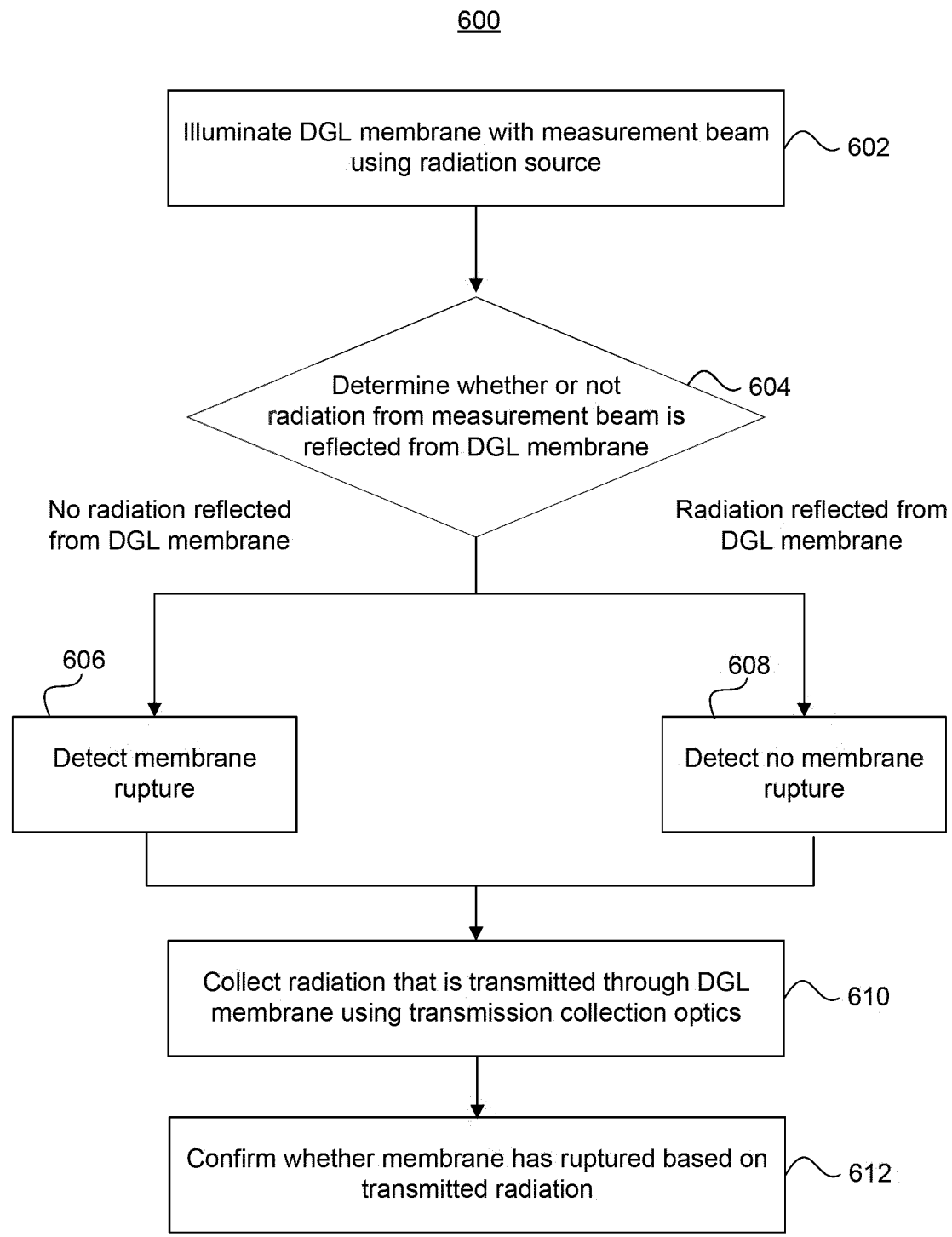
FIG. 6 is a schematic illustration of a flowchart for detecting rupture of a dynamic gas lock membrane in a lithographic apparatus, according to embodiments of the present disclosure.

FIG. 6 is a flowchart of an exemplary method 600 for detecting rupture of a dynamic gas lock membrane in a lithographic apparatus, according to embodiments of the present disclosure. In some embodiments, method 600 may describe the monitoring and detection of a rupture in dynamic gas lock membrane, such as dynamic gas lock membrane 304, 404, as discussed above with reference to FIGS. 3-5. It should be understood that the operations shown in method 600 are not exhaustive and that other operations can be performed as well before, after, or between any of the illustrated operations. In various embodiments of the present disclosure, the operations of method 600 can be performed in a different order and/or vary.

In operation 602, a dynamic gas lock membrane is illuminated with a measurement beam using a radiation source. The dynamic gas lock membrane can be arranged between a wafer and projection optics of a lithography apparatus, and the radiation source can be arranged above the dynamic gas lock membrane to illuminate off-axis.

In operation 604, reflection collection optics can be used to determine whether or not any radiation from the measurement beam is reflected from the dynamic gas lock membrane. The reflection collection optics can be arranged above the dynamic gas lock membrane and configured to capture any radiation that reflects back.

If it is determined that no radiation is reflected from the dynamic gas lock membrane, then the method proceeds to operation 606. In operation 606, a detector detects that the dynamic gas lock membrane has ruptured based on determining that the membrane has not reflected any radiation. A break or rupture in the membrane typically can cause the membrane to fall apart completely, which would prevent any reflection of light.

If it is determined that there is radiation that is reflected from the dynamic gas lock membrane, then the method proceeds to operation 608. In operation 608, a detector detects that the dynamic gas lock membrane is still intact and has not ruptured based on determining that the membrane has reflected radiation. If the membrane is able to reflect light from the measurement beam, then the membrane is still in one piece and undamaged by any rupture.

Operations 610 and 612 may optionally be performed to confirm the results of the membrane rupture detection.

In operation 610, transmission collection optics collects radiation that is transmitted through the dynamic gas lock membrane. Transmission collection optics is arranged below the membrane and configured to collect light that is transmitted through membrane.

In operation 612, the detector determines whether the dynamic gas lock membrane has ruptured based on the collection of transmitted radiation. In some embodiments, the intensity of the transmitted radiation is dependent on whether the membrane has ruptured or is still intact. A higher intensity of transmitted radiation indicates that the membrane has ruptured, whereas a lower intensity of transmitted radiation indicates that the membrane is still intact. In some embodiments, the transmitted radiation is used to check whether or not the radiation source is properly working and identify if the lack of a reflected radiation signal is the result of a faulty or defective radiation source.

Figure 7:
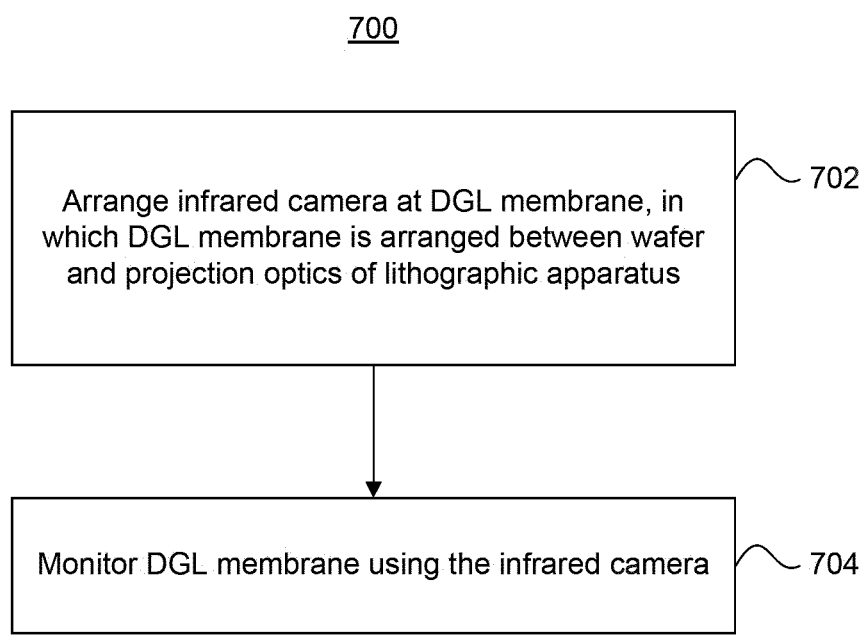
FIG. 7 is a schematic illustration of a flowchart for monitoring a dynamic gas lock membrane for rupture detection in a lithographic apparatus, according to embodiments of the present disclosure.

FIG. 7 is a flowchart of an exemplary method 700 for monitoring a dynamic gas lock membrane for rupture detection in a lithographic apparatus, according to embodiments of the present disclosure. In some embodiments, method 700 may describe end-of-life or health monitoring of a dynamic gas lock membrane using an infrared camera, such as dynamic gas lock membrane 304, 404, as discussed above with reference to FIGS. 3-5. It should be understood that the operations shown in method 700 are not exhaustive and that other operations can be performed as well before, after, or between any of the illustrated operations. In various embodiments of the present disclosure, the operations of method 700 can be performed in a different order and/or vary.

In operation 702, an infrared camera is arranged at a dynamic gas lock membrane in a lithographic apparatus. The dynamic gas lock membrane is arranged in between a wafer and projection optics of the lithographic apparatus, and the infrared camera is positioned above the dynamic gas lock membrane.

In operation 704, the dynamic gas lock membrane is monitored using the infrared camera. The infrared camera generates an image of the membrane using infrared radiation. In some embodiments, the infrared camera detects thermal radiation that emits from the dynamic gas lock membrane. In some embodiments, the infrared camera detects reflection or scattered infrared radiation from the dynamic gas lock membrane.

Figure 8:
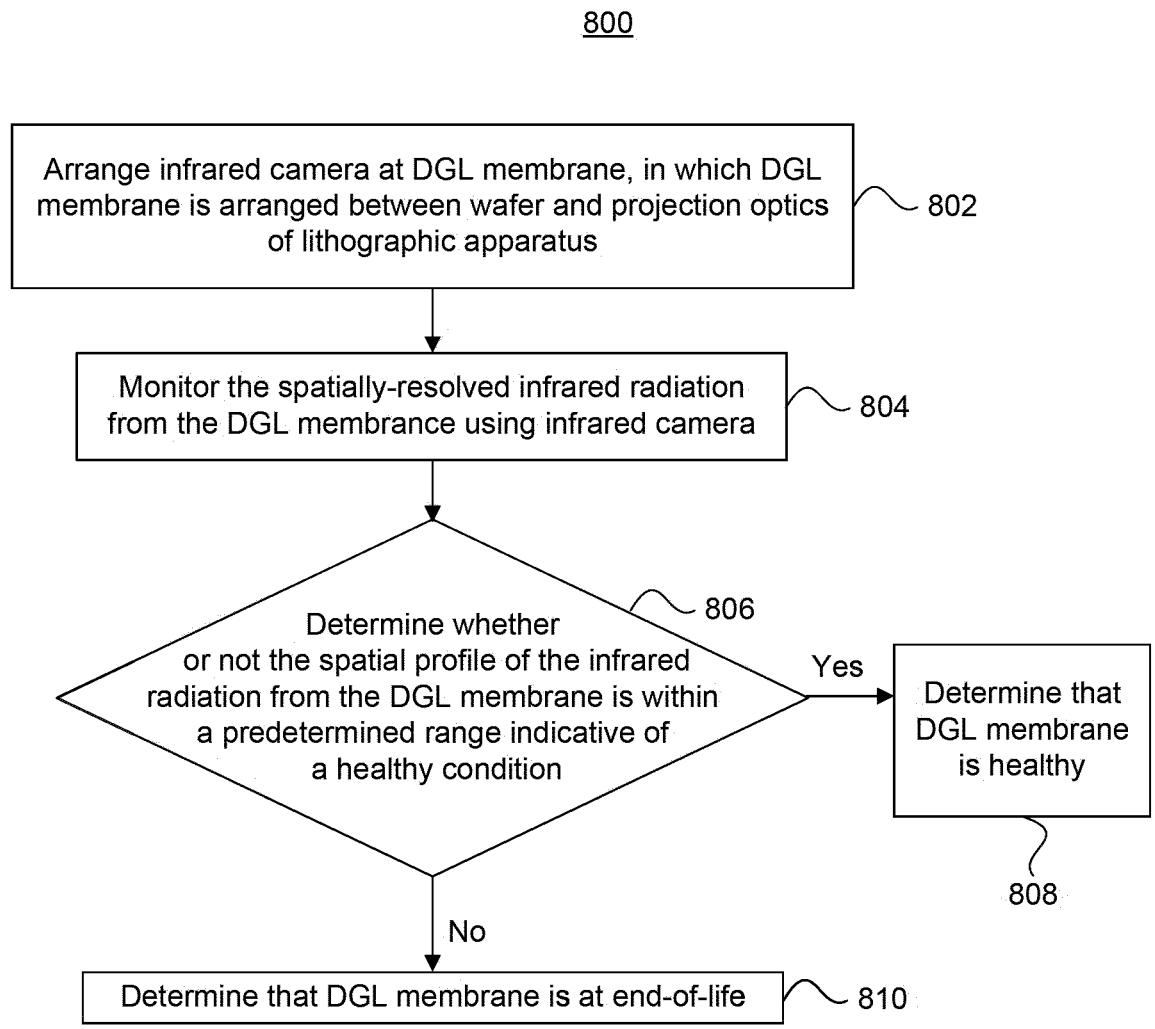
FIG. 8 is a schematic illustration of a flowchart for end-of-life detection of a dynamic gas lock membrane in a lithographic apparatus, according to embodiments of the present disclosure.

FIG. 8 is a flowchart of an exemplary method 800 for end-of-life detection of a dynamic gas lock membrane in a lithographic apparatus, according to embodiments of the present disclosure. In some embodiments, method 800 may describe using an infrared camera for end-of-life monitoring of a dynamic gas lock membrane, such as dynamic gas lock membrane 304, 404, as discussed above with reference to FIGS. 3-5. In particular, DGL membrane end-of-life detection may be based on monitoring spatially-resolved infrared radiation from the DGL membrane. It should be understood that the operations shown in method 800 are not exhaustive and that other operations can be performed as well before, after, or between any of the illustrated operations. In various embodiments of the present disclosure, the operations of method 800 can be performed in a different order and/or vary.

In operation 802, an infrared camera is arranged at a dynamic gas lock membrane in a lithographic apparatus. The dynamic gas lock membrane is arranged in between a wafer and projection optics of the lithographic apparatus, and the infrared camera is positioned above the dynamic gas lock membrane. In operation 804, spatially-resolved infrared radiation from the dynamic gas lock membrane is monitored using the infrared camera.

In operation 806, a spatial profile of the infrared radiation from the DGL membrane may be analyzed to determine whether or not it is within a predetermined threshold or a predetermined range indicative of a healthy condition. In some embodiments, the infrared camera or a computing device that is coupled to the infrared camera may analyze the spatially-resolved infrared radiation to determine whether or not the spatial profile has characteristics which are indicative of a DGL membrane in a healthy condition. In some embodiments, the spatially-resolved infrared radiation may generally be uniform if the DGL membrane is healthy (e.g., in good condition and not close to rupturing). In some embodiments, the spatially-resolved infrared radiation may become less uniform or non-uniform if the DGL membrane is in an end-of-life condition (e.g., close to rupturing).

If it is determined that the spatial profile of the infrared radiation from the DGL membrane is within the predetermined range (e.g., uniform spatial profile), then the method proceeds to operation 808. In operation 808, the infrared camera or the computing device that is coupled to the infrared camera determines that the DGL membrane is healthy.

If it is determined that the spatial profile of the infrared radiation from the DGL membrane is not within the predetermined range (e.g., non-uniform spatial profile), then the method proceeds to operation 810. In operation 810, the infrared camera or the computing device that is coupled to the infrared camera determines that the DGL membrane is at end-of-life. The determination may allow for the DGL membrane to be replaced prior to rupture, or replaced in order to obtain imaging performance. In some embodiments, the DGL membrane may be at end-of-life because of degraded imaging performance (e.g., due to EUV transmission not being uniform across the membrane). Thus, the DGL membrane may be unacceptable for customer usage and may be replaced for improved imaging performance.

Figure 9:
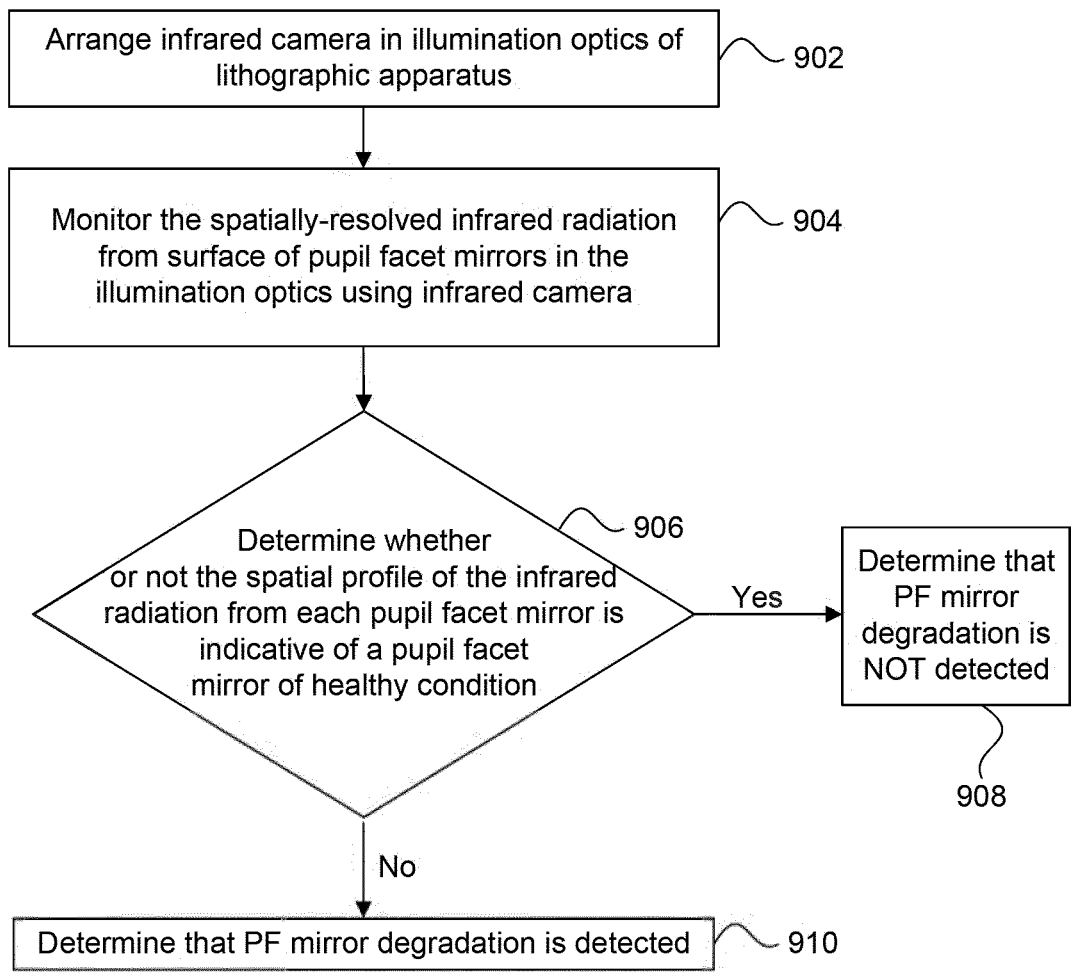
FIG. 9 is a schematic illustration of a flowchart for pupil-facet mirror degradation monitoring in a lithographic apparatus, according to embodiments of the present disclosure.

FIG. 9 is a flowchart of an exemplary method 900 for pupil-facet mirror degradation monitoring in a lithographic apparatus, according to embodiments of the present disclosure. In some embodiments, method 900 may describe using an infrared camera for pupil-facet mirror degradation monitoring. It should be understood that the operations shown in method 900 are not exhaustive and that other operations can be performed as well before, after, or between any of the illustrated operations. In various embodiments of the present disclosure, the operations of method 900 can be performed in a different order and/or vary.

In operation 902, an infrared camera is arranged in the illumination optics of the lithographic apparatus. In some embodiments, the infrared camera is arranged at the surface(s) of one or more pupil-facet mirrors in the illumination optics. In operation 904, spatially-resolved infrared radiation from the surface of the pupil-facet mirrors is monitored using the infrared camera.

In operation 906, a spatial profile of the infrared radiation from the pupil-facet mirrors may be analyzed to determine whether or not it is indicative of a pupil-facet mirror that is of a healthy condition. In some embodiments, the infrared camera or a computing device that is coupled to the infrared camera may analyze the spatially-resolved infrared radiation to determine whether or not the spatial profile has characteristics which are indicative of a pupil-facet mirror in a healthy condition (e.g., not degraded condition). In some embodiments, monitoring the PF mirror may include detecting damage spots present on the pupil facet mirror using the infrared camera.

If it is determined that the spatial profile of the infrared radiation from the pupil-facet mirror is indicative of a pupil-facet mirror of healthy condition, then the method proceeds to operation 908. In operation 908, the infrared camera or the computing device that is coupled to the infrared camera determines that pupil-facet mirror degradation has not been detected.

If it is determined that the spatial profile of the infrared radiation from the pupil-facet mirror is not indicative of a pupil-facet mirror of healthy condition, then the method proceeds to operation 910. In operation 910, the infrared camera or the computing device that is coupled to the infrared camera determines that pupil-facet mirror degradation has been detected.

The embodiments may further be described using the following clauses:

1. A method comprising:
  illuminating a dynamic gas lock membrane with a measurement beam using a radiation source, wherein the dynamic gas lock membrane is arranged between a wafer and projection optics of a lithography apparatus;
  determining whether any radiation from the measurement beam is reflected from the dynamic gas lock membrane by using reflection collection optics, wherein the reflection collection optics are arranged above the dynamic gas lock membrane;
  detecting whether or not the dynamic gas lock membrane has ruptured based on the determination, wherein:
    the dynamic gas lock membrane is ruptured if no radiation is reflected from the dynamic gas lock membrane, and
    the dynamic gas lock membrane is not ruptured if radiation is reflected from the dynamic gas lock membrane.

2. The method of clause 1, wherein the radiation source comprises a broadband light source or a single wavelength source.

3. The method of clause 1, further comprising:
  collecting radiation that is transmitted through the dynamic gas lock membrane using transmission collection optics.

4. The method of clause 3, further comprising: confirming whether or not the dynamic gas lock membrane has ruptured based on the collection of transmitted radiation.

5. The method of clause 3, further comprising: determining that the radiation source is working based on the presence of transmitted radiation.

6. The method of clause 1, wherein the detection is performed continuously during any state of the lithographic apparatus.

7. The method of clause 6, wherein any state of the lithographic apparatus includes during service, during transient or idle states, and during operation of the lithographic apparatus.

8. A lithographic apparatus comprising:
  an illumination system configured to condition a radiation beam;
  a support structure constructed to support a patterning device;
  a substrate table configured to hold a substrate;
  a projection system configured to project a pattern imparted to the radiation beam by the patterning device onto a target portion of a substrate;
  a dynamic gas lock membrane arranged between the projection system and the substrate structure;
  a radiation source configured to illuminate the dynamic gas lock membrane with a measurement beam;
  reflection collection optics arranged above the dynamic gas lock membrane and configured to determine whether any radiation from the measurement beam is reflected from the dynamic gas lock membrane; and
  a detector configured to detect whether or not the dynamic gas lock membrane has ruptured based on the determination, wherein:
    the dynamic gas lock membrane is ruptured if no radiation is reflected from the dynamic gas lock membrane, and
    the dynamic gas lock membrane is not ruptured if radiation is reflected from the dynamic gas lock membrane.

9. The lithographic apparatus of clause 8, wherein the radiation source comprises a broadband light source or a single wavelength source.

10. The lithographic apparatus of clause 8, further comprising: transmission collection optics that are arranged below the dynamic gas lock membrane and configured to collect radiation that is transmitted through the dynamic gas lock membrane.

11. The lithographic apparatus of clause 10, wherein the transmitted radiation collected by the transmission collection optics is utilized to confirm whether or not the dynamic gas lock membrane has ruptured.

12. The lithographic apparatus of clause 10, wherein the detector is coupled to the reflection collection optics and transmission collection optics and configured to detect the reflected radiation and changes in transmitted light intensity.

13. The lithographic apparatus of clause 8, wherein the radiation source, the reflection collection optics, and the detector are configured to operate during any state of the lithographic apparatus.

14. The lithographic apparatus of clause 13, wherein any state of the lithographic apparatus includes during service, during transient or idle states, and during operation of the lithographic apparatus.

15. A method comprising:
arranging an infrared camera at a dynamic gas lock membrane, wherein the dynamic gas lock membrane is arranged between a wafer and projection optics of a lithographic apparatus; and monitoring the dynamic gas lock membrane using the infrared camera.

16. The method of clause 15, wherein monitoring the dynamic gas lock membrane further comprises:
detecting thermal radiation that emits from the dynamic gas lock membrane.

17. The method of clause 15, wherein monitoring the dynamic gas lock membrane further comprises:
detecting reflection or scattered infrared radiation from the dynamic gas lock membrane.

18. The method of clause 15, wherein the infrared camera is high resolution and allows spatially-resolved monitoring.

19. The method of clause 15, further comprising:
monitoring a pupil facet mirror in the lithographic apparatus using the infrared camera.

20. The method of clause 19, wherein monitoring the pupil facet mirror further comprises detecting damage spots present on the pupil facet mirror using the infrared camera.

Although specific reference may be made in this text to a "reticle," it should be understood that this is just one example of a patterning device and that the embodiments described herein may be applicable to any type of patterning device. Additionally, the embodiments described herein may be used to provide safety support for any object to ensure a clamping failure does not cause the object to fall and damage either itself or other equipment.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track unit (a tool that typically applies a layer of resist to a substrate and develops the exposed resist), a metrology unit and/or an inspection unit. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the disclosure in the context of optical lithography, it will be appreciated that the disclosure can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the disclosure in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the disclosure have been described above, it will be appreciated that the disclosure can be practiced otherwise than as described. The description is not intended to limit the disclosure.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of the present disclosure should not be limited by any of the above-described exemplary embodiments, but should be defined only in accordance with the following claims and their equivalents.

The invention claimed is:

1. A method comprising:
   illuminating a dynamic gas lock membrane with a measurement beam using a radiation source, wherein the dynamic gas lock membrane is arranged between a wafer and projection optics of a lithography apparatus;
   determining whether any radiation from the measurement beam is reflected from the dynamic gas lock membrane by using reflection collection optics, wherein the reflection collection optics are arranged above the dynamic gas lock membrane; and
   detecting whether or not the dynamic gas lock membrane has ruptured based on the determination, wherein:
   the dynamic gas lock membrane is ruptured if no radiation is reflected from the dynamic gas lock membrane, and
   the dynamic gas lock membrane is not ruptured if radiation is reflected from the dynamic gas lock membrane.

2. The method of claim 1, wherein the radiation source comprises a broadband light source or a single wavelength source.

3. The method of claim 1, further comprising:
   collecting radiation that is transmitted through the dynamic gas lock membrane using transmission collection optics.

4. The method of claim 3, further comprising:
   confirming whether or not the dynamic gas lock membrane has ruptured based on the collection of transmitted radiation.

5. The method of claim 3, further comprising:
   determining that the radiation source is working based on the presence of transmitted radiation.

6. The method of claim 1, wherein the detection is performed continuously during any state of the lithographic apparatus.

7. The method of claim 6, wherein any state of the lithographic apparatus includes during service, during transient or idle states, and during operation of the lithographic apparatus.

8. The method of claim 1,
   wherein using reflection collection optics comprises using an infrared camera arranged at the dynamic gas lock membrane.

9. The method of claim 8,
   further comprising using the infrared camera to detect thermal radiation that emits from the dynamic gas lock membrane.

10. The method of claim 8, wherein the infrared camera is high resolution and allows spatially-resolved monitoring.

11. The method of claim 8, further comprising:
    monitoring a pupil facet mirror in the lithographic apparatus.

12. The method of claim 11, wherein monitoring the pupil facet mirror further comprises detecting damage spots present on the pupil facet mirror.

13. A metrology unit configured to implement the method of claim 1.

14. A lithographic apparatus comprising:
    an illumination system configured to condition a radiation beam;
    a support structure constructed to support a patterning device;
    a substrate table configured to hold a substrate;
    a projection system configured to project a pattern imparted to the radiation beam by the patterning device onto a target portion of a substrate;
    a dynamic gas lock membrane arranged between the projection system and the substrate table;
    a radiation source configured to illuminate the dynamic gas lock membrane with a measurement beam;
    reflection collection optics arranged above the dynamic gas lock membrane and configured to determine whether any radiation from the measurement beam is reflected from the dynamic gas lock membrane; and
    a detector configured to detect whether or not the dynamic gas lock membrane has ruptured based on the determination, wherein:
    the dynamic gas lock membrane is ruptured if no radiation is reflected from the dynamic gas lock membrane, and
    the dynamic gas lock membrane is not ruptured if radiation is reflected from the dynamic gas lock membrane.

15. The lithographic apparatus of claim 14, wherein the radiation source comprises a broadband light source or a single wavelength source.

16. The lithographic apparatus of claim 14, further comprising: transmission collection optics that are arranged below the dynamic gas lock membrane and configured to collect radiation that is transmitted through the dynamic gas lock membrane.

17. The lithographic apparatus of claim 16, wherein the transmitted radiation collected by the transmission collection optics is utilized to confirm whether or not the dynamic gas lock membrane has ruptured.

18. The lithographic apparatus of claim 16, wherein the detector is coupled to the reflection collection optics and transmission collection optics and configured to detect the reflected radiation and changes in transmitted light intensity.

19. The lithographic apparatus of claim 14, wherein the radiation source, the reflection collection optics, and the detector are configured to operate during any state of the lithographic apparatus.

20. The lithographic apparatus of claim 19, wherein any state of the lithographic apparatus includes during service, during transient or idle states, and during operation of the lithographic apparatus.

* * * * *